United States Patent
Li

(10) Patent No.: US 8,117,581 B1
(45) Date of Patent: Feb. 14, 2012

(54) SELF-PROPELLING DECOUPLING CAPACITOR DESIGN FOR FLEXIBLE AREA DECOUPLING CAPACITOR FILL DESIGN FLOW

(75) Inventor: Mu-Jing Li, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 1192 days.

(21) Appl. No.: 11/449,057

(22) Filed: Jun. 7, 2006

(51) Int. Cl.
    G06F 17/50 (2006.01)
(52) U.S. Cl. .................................. 716/120; 716/122
(58) Field of Classification Search ............. 716/10–14, 716/118–125
    See application file for complete search history.

(56) References Cited

U.S. PATENT DOCUMENTS

| | | | | |
|---|---|---|---|---|
| 6,925,627 B1 * | 8/2005 | Longway et al. | ............... | 716/13 |
| 6,941,535 B2 * | 9/2005 | Sekido | .......................... | 257/207 |
| 7,102,204 B2 * | 9/2006 | Berndlmaier et al. | ........ | 257/532 |
| 7,417,328 B2 * | 8/2008 | Li et al. | .......................... | 257/786 |
| 2006/0085778 A1 * | 4/2006 | Keinert et al. | .................... | 716/9 |

\* cited by examiner

*Primary Examiner* — Jack Chiang
*Assistant Examiner* — Binh Tat
(74) *Attorney, Agent, or Firm* — Martine Penilla Group, LLP

(57) ABSTRACT

A method of filling dcaps in an integrated circuit includes identifying a set of dcap-eligible areas of the integrated circuit for areas large enough to accommodate at least one dcap cell having a selected size smaller than a default size. The dcap cell includes at least one built-in power track. A set of dcap cells are filled in the identified set of dcap-eligible areas. Each of the built-in power tracks included in the set of dcap cells is connected to a corresponding power grid. An integrated circuit including a power grid channel formed between at least two power grids and a plurality of dcaps including a first dcap included in a dcap cell, the dcap cell including built-in power tracks, each one of the built-in power tracks being connected to a corresponding one of the at least two power grids is also described.

8 Claims, 6 Drawing Sheets

SELF-PROPELLING DECOUPLING CAPACITOR DESIGN FOR FLEXIBLE AREA DECOUPLING CAPACITOR FILL DESIGN FLOW

BACKGROUND

The present invention relates generally to integrated circuit design, and more particularly, to methods and systems for designing and placing decoupling capacitors in an integrated circuit.

Power supply decoupling capacitors (dcaps) are typically connected between two power supply rails in an integrated circuit design. The dcaps provide dynamic decoupling to noise on the power supply rails or grids. By way of example, one or more dcaps can be connected between Vdd and Vss power grids. The decoupling operation stabilizes the power supply, reduces the electro-magnetic interference (EMI) emissions and increases the circuit reliability.

Traditional dcap design and size and location are focused on existing power grids. By way of example, the traditional dcaps are designed to be seated precisely between a pair of Vdd and Vss power grids. The dcaps are placed along a channel formed by the Vdd and Vss power grids. Placing the dcaps along the channel formed by the power grids is referred to as a linear dcap fill. The dcaps are butted together whenever possible. If it is not possible to butt the dcaps together, then the dcaps are separated by a specifically separated, constant space.

FIG. 1 shows a typical design and placement 100 of dcaps over a channel. The dcaps 112A-D are placed across the channel 101 formed by the power grid of Vss 102 and Vdd 104. Dcap 112D cannot be butted to dcap 112C due to design object 108 (e.g., a via). Similarly, dcap 112B cannot be butted to dcap 112A due to design object 106. Conversely, dcap 112C is butted up to dcap 112B. Design objects 106 and 108 would electrically short any dcap placed between dcaps 112A and 112B or between dcaps 112C and 112D. Further, the design objects 106 and 108 can also block any dcaps due to a design rule violation (e.g., device spacing limitations). Even though the objects 106 and 108 are relatively small in area as compared to the dcap, the objects still block at least an entire dcap.

In a typical design, the power grid is usually started from metallization layer M2. Each of the dcaps 112A-112D include an insulating layer 118 (e.g., dielectric) separating two conductive layers (e.g. metal layer or diffused region of a layer). The two conductive layers are typically in layers below the metal layer (e.g., M2 layer) containing the power grid. The dcaps 112A-112D connect to the Vss 102 in the M2 power grid through electrical contacts 114A-D. Similarly, the dcaps 112A-112D connect to the Vdd 104 in the M2 power grid through electrical contacts 116A-D. The higher metal the dcap connects to, the more chance a dcap would be blocked by the structures (e.g., objects 106 and 108) one or more of the underlying metal layers.

Unfortunately as integrated circuit density is increased the traditional dcap designs are difficult and inefficient to achieve the desired dcap size and location. Specifically, the dcaps are large enough to be seated between the power grid pair. As the integrated circuit density is increased there are fewer and smaller areas available for the desired dcap size. The linear dcap fill requirement eliminates many other potential areas that do not include the two power grids and therefore do not have a channel required by the linear fill. The dcaps can block the routing channel if the dcaps are placed ahead of the routing. Alternatively, the routed wires may block the channel for filling the dcaps, if the dcap is placed after the routing. One short wire can block a relatively large area.

Different types of circuits are used in different portions or blocks of the integrated circuit (e.g., a control block, a data path block, an I/O block, etc.). Each different block may have different widths between the power grids, as a result, the dcaps cannot be formed at a uniform size or spacing.

In view of the foregoing, there is a need for a more flexible approach to designing and placing dcaps.

SUMMARY

Broadly speaking, the present invention fills these needs by providing a flexible approach to designing and placing dcaps. It should be appreciated that the present invention can be implemented in numerous ways, including as a process, an apparatus, a system, computer readable media, or a device. Several inventive embodiments of the present invention are described below.

One embodiment provides a method of filling dcaps in an integrated circuit and includes identifying a set of dcap-eligible areas of the integrated circuit for areas large enough to accommodate at least one dcap cell having a selected size smaller than a default size. The dcap cell includes at least one built-in power track. A set of dcap cells are filled in the identified set of dcap-eligible areas. Each of the built-in power tracks included in the set of dcap cells is connected to a corresponding power grid.

Identifying the set of dcap-eligible areas includes identifying a first subset of dcap-eligible areas along the power grid and wherein filling the set of dcap cells in the identified set of dcap eligible areas includes butting together two or more dcap cells to fill the first subset of the dcap-eligible areas.

Identifying the set of dcap-eligible areas can include dividing the integrated circuit into a plurality of rows, each one of the plurality of rows having a height substantially equal to a height of the dcap cell and dividing each one of the plurality of rows into a plurality of equal shaped areas, wherein each one of the plurality of equal shaped areas having a shape substantially equal to a shape of the dcap cell and analyzing each one of the plurality of equal shaped areas to determine if each one of the plurality of equal shaped areas is a dcap-eligible area. The set of dcap cells can include dcaps having a shape other than the default shape. The built-in power tracks can have a pitch different than a pitch of the corresponding power grids. The corresponding power grids include at least one Vdd power grid and at least one Vss power grid.

Connecting each one of the built-in power tracks included in the set of dcap cells to the corresponding power grids can include connecting at least one of the built-in power tracks included in the set of dcap cells to the more than one corresponding power grid. Filling the set of dcap cells including built-in power tracks can include butting together two or more of the set of dcap cells. The two or more of the set of dcap cells can be butted together in a horizontal array. The two or more of the set of dcap cells can alternatively be butted together in a vertical array.

The method of filling dcaps in an integrated circuit can be embodied in a computer readable media in a computer system. The computer system can include a computer aided design application including the method of filling dcaps in an integrated circuit.

Another embodiment provides a method of filling dcaps in an integrated circuit includes identifying a set of dcap-eligible areas of the integrated circuit for areas large enough to accommodate at least one dcap cell having a selected size smaller than a default size. The dcap cell including at least one built-in power track. A set of dcap cells are filled in the identified set of dcap eligible areas including butting together two or more of the set of dcap cells. The two or more of the set of dcap cells are butted together in at least one of a horizontal array or a vertical array and each one of the built-in power tracks included in the set of dcap cells are connected to a corresponding power grid.

Yet another embodiment provides an integrated circuit including a power grid channel formed between at least two power grids and a plurality of dcaps including a first dcap included in a dcap cell, the dcap cell including built-in power tracks, each one of the built-in power tracks being connected to a corresponding one of the at least two power grids is also described.

At least a portion of the dcaps are not located within the power grid channel. The built-in power tracks can have a pitch different than a pitch of the power grids. The built-in power tracks can have a pitch less than the pitch of the power grids.

The built-in power tracks can be formed in an adjacent metal layer to the metal layer including the power grids. The built-in power tracks can be formed in an m1 metal layer of the integrated circuit and the power grids are formed in an m2 metal layer of the integrated circuit. Two or more of the plurality of dcaps are butted together in at least one of a horizontal array or a vertical array.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1:
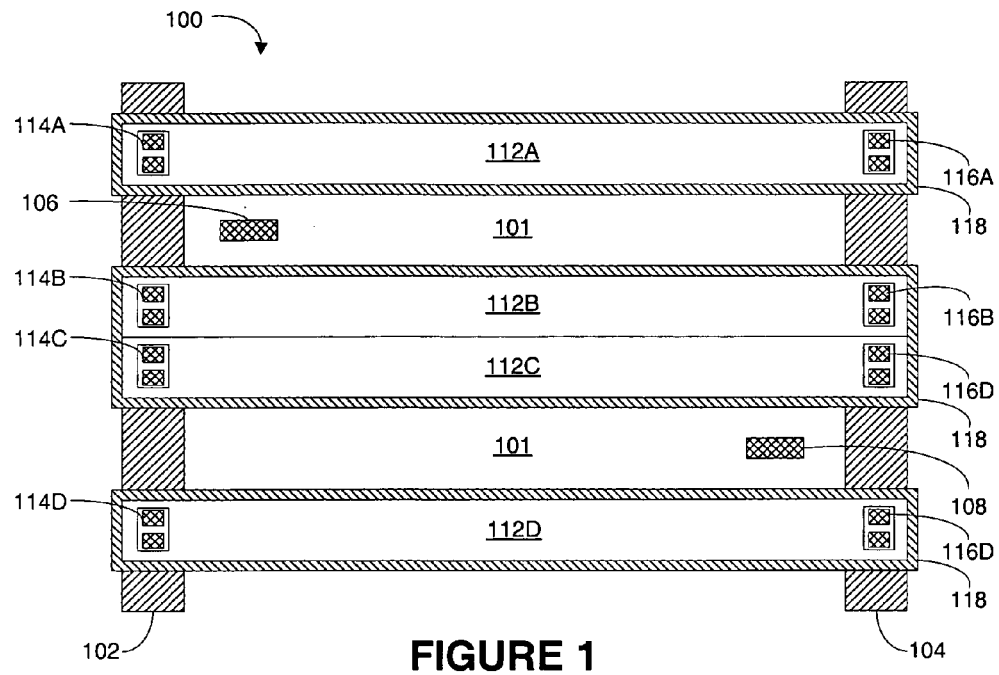
FIG. 1 shows a typical design and placement of dcaps over a channel.

Several exemplary embodiments for a flexible approach to designing and placing dcaps in an integrated circuit will now be described. It will be apparent to those skilled in the art that the present invention may be practiced without some or all of the specific details set forth herein.

In one approach, the dcaps can be formed in any areas within the integrated circuit that allows the dcap to be connected to the power grid but not necessarily within the power grid channels. This approach avoids the disadvantages described above and also meets the dcap requirements of nanometer-scale device densities. As a result, a flexible area dcap fill concept is formed and a dcap fill process can be developed using this approach. The dcap design and fill process is sufficiently flexible to be substantially independent of any individual semiconductor design or process.

Unlike the prior art designs, the dcap fill area is not restricted to only the channels formed by a Vdd/Vss power grid pair. The present invention allows a dcap cell to be filled in any location within an integrated circuit providing sufficient usable area and access to connect the dcap to the power grid (e.g., Vdd and Vss).

One embodiment of dcap cell design can also include a butting rule to define how to butt two or more dcaps together to form larger effective area dcaps. The dcaps are preferably formed in lower level layers with the fewest possible metal layers between the dcap and the power grid. Very few other restrictions are needed to form and locate the dcaps.

The flexible dcap design described herein also allows various sizes of dcaps. The various sizes of dcaps aids in maximizing dcap density. The actual size of each dcap can be adjusted as necessary (e.g., to allow use of a smaller area available in the integrated circuit). A smaller dcap size allows more dcaps to be formed in ever-smaller areas. A reasonably small size dcap can be selected as a universal dcap cell size that is used for most of the dcap cells. The reasonably small size dcap can be smaller than a typical prior art dcap that spans the channel between the power grids. The single selected reasonably small size dcap can balance the actual gain and time to design the dcaps.

The power grids can be extended into any dcap eligible areas to provide for more areas suitable for placing the dcaps. The flexible area dcap fill process can be one of the last processes (e.g., just before the final metal fill), therefore adding more power grids in those areas is generally not a problem because the areas would typically be filled by metal anyway.

In addition to the added dcap density and the power grid independency, the proposed dcap cells do not need to be prefilled before routing. This improves the design routability and simplifies the overall design and manufacturing process.

The dcap cell works best if the dcap cell is formed in the layers closest to the power grids to substantially eliminate intervening devices, structures and metal layers. By way of example, the power grids are often in the metal 2 (m2) layer. A dcap cell that contains only metal 1 (m1) layer has fewer design constraints to meet when it is placed. As a result, more eligible areas can be found for placing such dcaps.

Potential dcap-eligible areas in an integrated circuit design are identified. A dcap-eligible area is an area where a dcap cell can be placed and connected to the corresponding power grids without interfering with other design parameters and devices. Initially, a dcap cell size is selected. The dcap cell size can by any usable size. The smaller the dcap cell size the more area that can ultimately be filled by the dcap cells. A first portion of dcap-eligible areas are identified as areas able to accommodate one or more dcap cells of the selected size and provide access to the corresponding power grids. A first set of dcap cells can be placed in the identified dcap-eligible areas. Following the placement of the first set of dcap cells, the remaining dcap-eligible area can be examined to determine if there are additional locations where additional dcap cells can be placed.

A Self-Propelling Dcap Cell Concept

The self-propelling dcap cells can be formed by providing a connection to the power grid that is not necessarily part of the power grid channel. In order to provide a power grid connection, the dcap cell includes its own power tracks that can be connected to the corresponding power grids (e.g., through a via or other connecting structure). This power grid connection allows the dcap cell to be formed independent of the location and direction of the pitched power grids. Internally, a dcap cell's built-in power track is used to tie to the different material of the dcap. Externally, the dcap cell's built-in power tracks provide a power connection that is independent of the power grids. The built in power tracks allow the dcap cell to be placed or propelled to anywhere where there is area sufficient to accommodate the dcap cell (e.g., within or to the left or to the right of the power grid channels). In addition, butting two or more dcap cells can automatically extend the built-in power tracks. When the dcap cells form a row, the extended, built-in power track can even overlap the pitched upper-level or lower-level metal power grid. By way of example, the built-in power tracks can be perpendicular (or some angle other than perpendicular) to the power grids. The built-in power tracks can be tied to the power grid through vias or other suitable types of connection structures. The built-in power tracks provide additional connection points than the power grid channel described by the prior art methods and structures. When the built-in power tracks connect to the other level metal power grids, the dcaps can be placed along the built-in power tracks as if the dcaps were running along as a train on the built-in power tracks.

The relatively small size of the dcap cell allows increased fill probability. The built-in power tracks allow the dcap cell size to be independent of the pitch of the power grids. By comparison, the prior art dcaps are built to extend across a power grid channel and therefore must have a longest dimension sufficiently long enough to span across the pitch of the power grids. As a result, the dcap cell size can be reduced to sizes substantially smaller than the pitch of the power grids. The smaller dcap cell size is limited only to the pitch of the built-in power tracks. As a result, the dcap cell fill probability increases. By way of example, if the dcap cell width is only one fifth of the width of a traditional dcap cell, the effective dcap lost could be only about 20% of the original number.

If the dcap cell can contain the lowest metal layer as its built-in power track, then the possibility of conflicting with other existing metal structures is substantially reduced. Therefore, the dcap cell fill can be the second last design process and can precede the metal fill, thereby simplifying the routing process.

Dcap cells can be butted together horizontally and/or vertically to form larger effective-area dcaps. Dcap cells can be butted horizontally to form a dcap array in the direction of and substantially in-line with the built-in power tracks. One or more dcaps can be butted to the sides of the horizontal dcap array (e.g., vertically butted) to add yet additional dcap area. By way of example, the vertically butted dcap cells can include built-in power tracks that are separate from the power tracks in the horizontal dcap array.

Figure 2A:
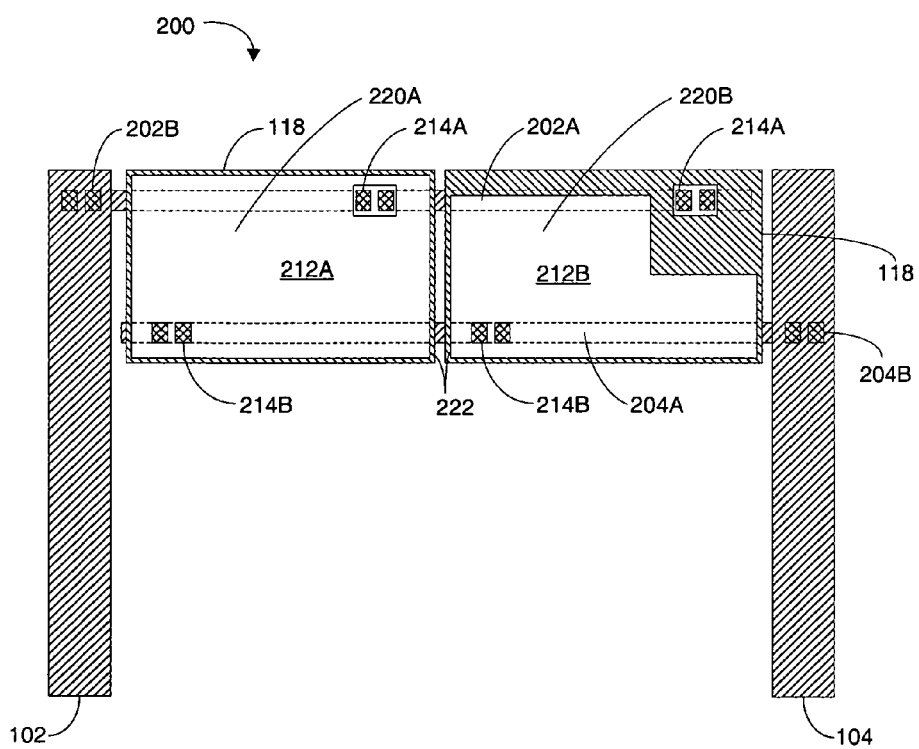
FIG. 2A is a top view of a dcap cell design in accordance with an embodiment of the present invention.

FIG. 2A is a top view of a dcap cell design 200 in accordance with an embodiment of the present invention. The dcap cell design 200 includes two dcap cells 212A and 212B located between the power grid of Vss 102 and Vdd 104. It should be understood that the dcap cells 212A and 212B could similarly be located to the left or the right of both of the power grids 102 and 104.

Each of the dcap cells 212A and 212B include built-in power tracks 202A and 204A. The built-in power tracks 202A and 204A are connected respectively to the Vss 102 and Vdd 104 by connections 202B and 204B, respectively.

Dcap cell 212A is approximately rectangular in shape where dcap cell 212B is irregularly shaped. Dcap cell 212B is irregularly shaped so as to allow the dcap to be used in a location that would not allow a rectangular shape. While dcap cells 212A and 212B are approximately one half the size of the prior art dcaps 112A-112D shown in FIG. 1, it should be understood that the dcap cells 212A and 212B are not limited to being half the size of the prior art dcaps and can be any suitable size. It should also be understood that while dcap cells 212A and 212B are shown spanning the power grid 102 and 104, it should be understood that the dcap cells 212A and 212B could extend over one or both sides of the power grid 102 and 104.

Built-in power tracks 202A and 204A connect to a poly layer 118 and active layer 220A and 220B through contacts 214A and 214B, respectively. Metal width can be selected to make sure that when the dcap cells 212A and 212B are placed, an m1 metal density rule is met inside the effective area dcaps.

Figure 2B:
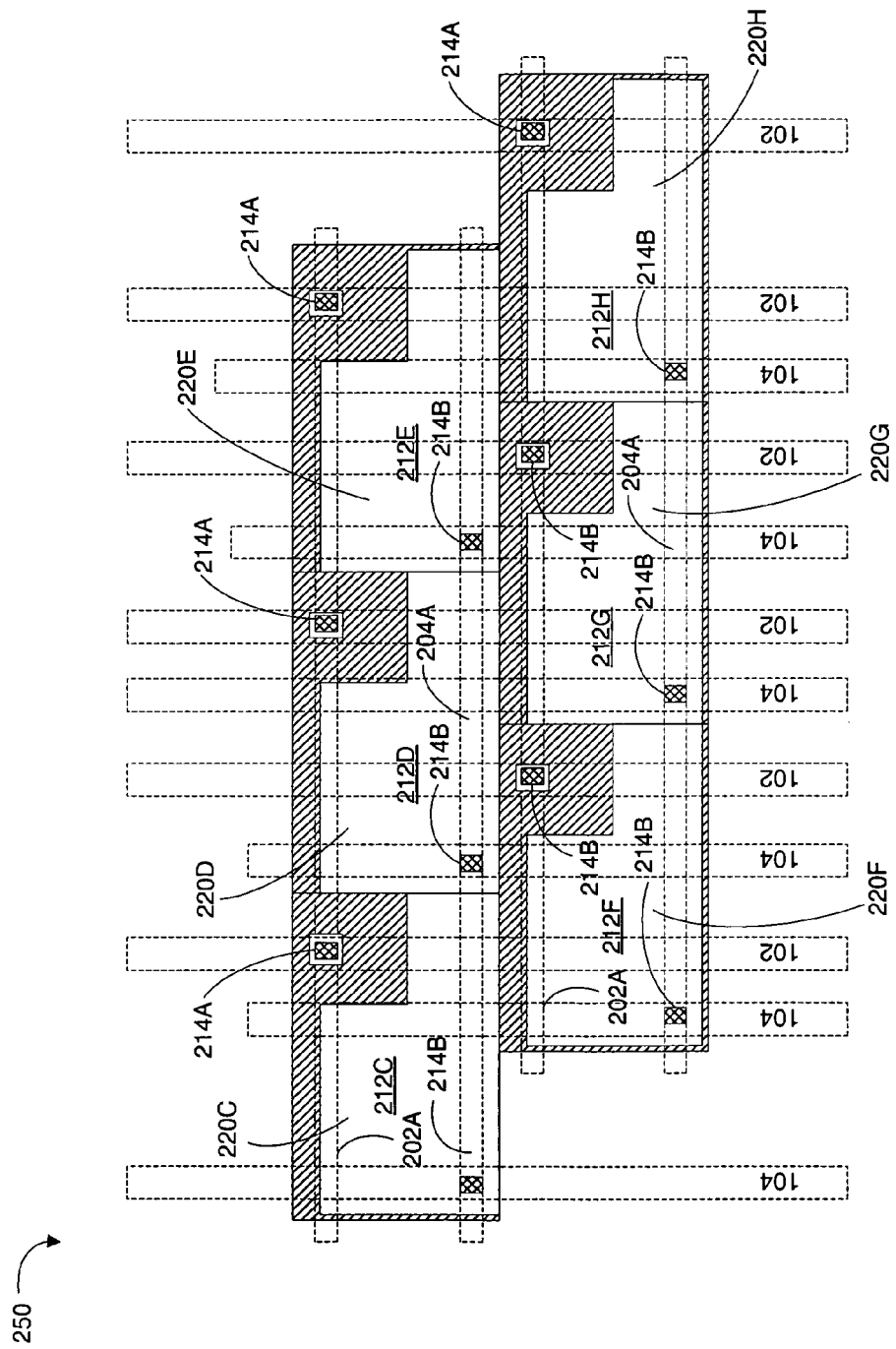
FIG. 2B shows multiple dcap cells butted together, in accordance with one embodiment of the present invention.

A butting guidance 222 is provided for the process flow to define how to butt dcap cells 212A and 212B to form effective a single larger area dcap cells. FIG. 2B shows multiple dcap cells butted together, in accordance with one embodiment of the present invention. Dcap cells 212C-212E can butt horizontally to form a row of dcap cells. One or more additional dcap cells 212F-212H can be butted vertically to one or more sides of the row of dcap cells 212C-212E.

Because the dcap cell design 200 is independent of the power grid pitch and because the dcap cells 212A-H can be dynamically filled, the dcap cell fill process can be the one of the last manufacturing and design processes. By way of example the dcap cells 212A-H can be dynamically filled as a last process preceding a metal fill process. Allowing the dcap cells 212A-H to be filled as one of the last manufacturing and design processes allows improved routability, and also gives allows additional freedom to add additional m2 power resources (e.g., 202A and 204A) that have a pitch different from the power grid pitch. The additional m2 power resources can be treated as if they were fill metal. These additional m2 power resources provide additional dcap-eligible area to be filled, thereby provides increased dcap density.

Figure 3:
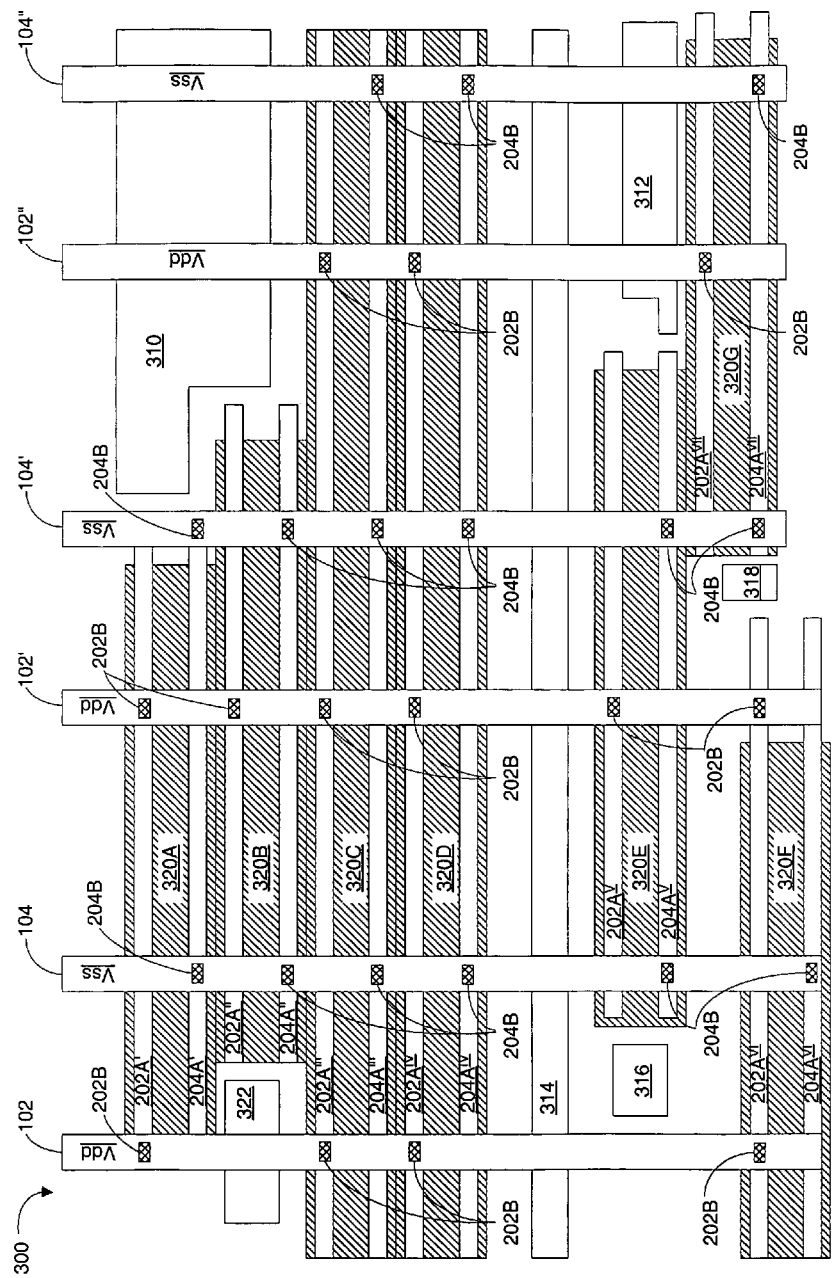
FIG. 3 is an integrated circuit, in accordance with an embodiment of the present invention.

FIG. 3 is an integrated circuit 300, in accordance with an embodiment of the present invention. The integrated circuit 300 includes power grids 102, 102', 102", 104, 104' and 104" and multiple butted together dcap cells to form effective area dcap cells 320A-320G. The built-in m1 power tracks 202A'-202A$^{VII}$ and 204A'-204A$^{VII}$ are self-propelling to locations having area suitable for a dcap cell. The built-in m1 power tracks 202A'-202A$^{VII}$ and 204A'-204A$^{VII}$ are tied to one or more of the corresponding Vdd/Vss power grids 102, 102' and 102" and 104, 104' and 104". The built-in m1 power tracks 202A' and 204A' included in dcap array 320A are tied to two sets of corresponding Vdd and Vss m2 grids 102 and 104 and 102' and 104' at respective connections 202B and 204B. The built-in m1 power tracks 202A" and 204A" included in dcap array 320B are tied to only to one corresponding Vdd power grid 102' and two corresponding Vss power grids 104 and 104' because design object 322 blocks access to the Vdd grid 102 and design object 310 blocks access to the Vdd grid 102" and Vss grid 104". Similarly, the built-in m1 power tracks 202A$^V$ and 204A$^V$ included in dcap array 320E are tied to only to one corresponding Vdd power grid 102' and two corresponding Vss power grids 104 and 104' because design object 316 blocks access to the Vdd grid 102 and design object 312 blocks access to the Vdd grid 102" and Vss grid 104". Similarly, the built-in m1 power tracks 202A' and 204A' included in dcap array 320F are tied to two corresponding Vdd power grids 102 and 102' and only one corresponding Vss power grid 104' because design object 318 blocks access to the Vss grid 104'. Also similarly, the built-in m1 power tracks 202A$^{VII}$ and 204A$^{VII}$ included in dcap array 320G are tied to two corresponding Vss power grids 104' and 104" and only one corresponding Vdd power grid 102" because design object 318 blocks access to the Vdd grid 102'. The built-in m1 power tracks 202A''' and 204A''' included in dcap array 320C are tied to three sets of Vdd and Vss power grids 102, 102' and 102" and 104, 104' and 104". Similarly, the built-in m1 power tracks 202A$^{IV}$ and 204A$^{IV}$ included in dcap array 320D are tied to three sets of corresponding Vdd and Vss power grids 102, 102' and 102" and 104, 104' and 104".

Dcap arrays 320A, 320B, 320C and 320D are butting together vertically to form a single, much larger effective-area dcap cell. Among them, dcap X coordinates are aligned between dcap arrays 320C and 320D. Dcap array 320E and 320G are also butting together vertically without aligning their respective dcap X coordinates to form another effective dcap cell.

The DCAP Design is for DCAP Fill Flow

The dcap cell design described in FIGS. 2A-3 above can be used in an automatic design process flow to identify the dcap-eligible areas in an integrated circuit, identify the shapes and sizes of the dcap cells to maximize the dcap density in the dcap-eligible areas and also combine or otherwise butt together one or more single dcap cells to form larger, effective area dcap cells. The dcap cell design style maintains a different size of dcap cell can be used by the same flow to reach different design goals.

While the power grids described herein refers to Vdd and Vss, it should be understood that the methods and systems described herein can be used to design, fill and form dcaps can be used with any type of power grid in an integrated circuit.

Other than meeting the dcap design rules described above, there are virtually no other restrictions on the shape of each dcap cell. The flexible dcap cell design allows the maximum dcap density requirements to be met by adjusting the actual dcap cell size. A reasonable, small size dcap cell can be used as the universal dcap cell size for most of the dcap cells to balance the actual gain and time to get the dcaps filled.

Figure 4A:
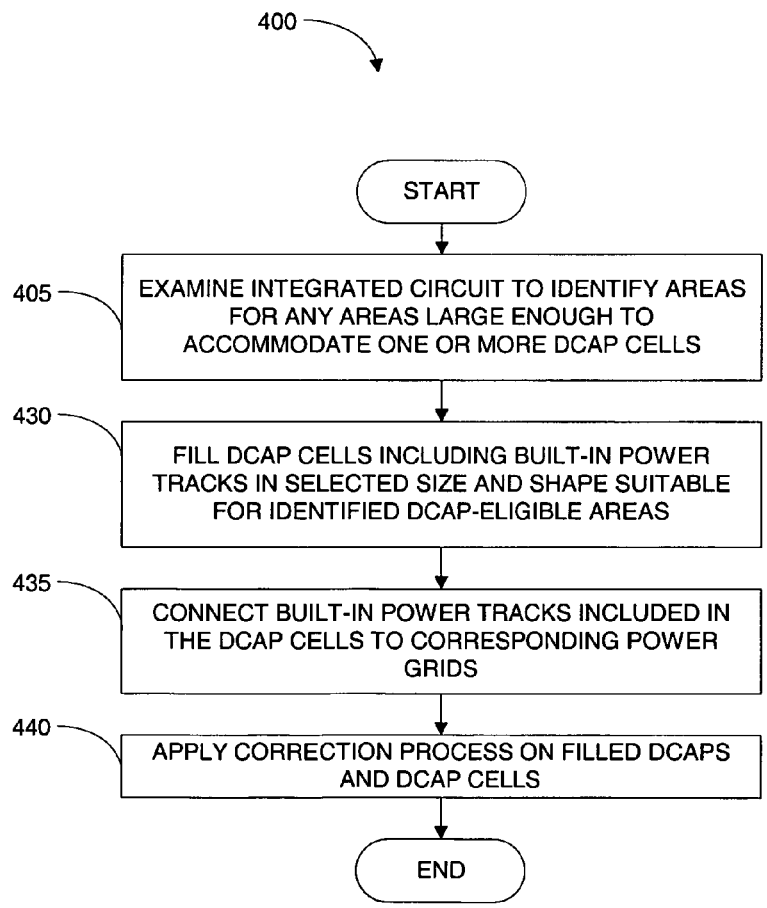
FIGS. 4A and 4B are flowchart diagrams that illustrate the method operations performed in filling and/or forming dcaps, in accordance with two embodiments of the present invention.

FIG. 4A is a flowchart diagram that illustrates the method operations 400 performed in filling and/or forming dcaps, in accordance with an embodiment of the present invention. In an operation 405, the integrated circuit is examined to identify any dcap-eligible areas in an integrated circuit.

By way of example, a dcap-eligible area is large enough to accommodate one or more dcap cells. The dcap cells can have a smaller size and/or different shape than typical prior art dcaps. The dcap-eligible areas may or may not be directly aligned with the Vdd and Vss power grids. By way of example, the dcap-eligible areas may be situated to one side of the Vdd and Vss power grids.

The dcap-eligible areas can also be smaller and/or different shaped than the default size and shape dcaps from the prior art. The dcap-eligible areas can be substantially smaller than the power grid channel as the second set of dcap-eligible areas are only required to be large enough to accommodate dcap cells of a selected size and/or a selected shape. The selected size and shape of dcap cells used to fill the second set of dcap-eligible areas can be the same as or different than the selected size and/or shape dcap cells used to fill the first set of dcap-eligible areas.

In an operation 430, a set of dcap cells including built-in power tracks are filled in the size and shape suitable for the dcap-eligible areas. The built-in power tracks can be formed in a metal layer other than the metal layer including the corresponding power grids. A minimum number of intervening metal layers and structures are formed between the metal layer containing the built-in power tracks and the metal layer including the corresponding power grids.

In an operation 435, the built-in power tracks included in the dcap cells are connected to the corresponding power grids.

In an optional operation 440, a correction process can be applied on the filled dcaps and dcap cells to correct any possible spacing and width violation.

Figure 4B:
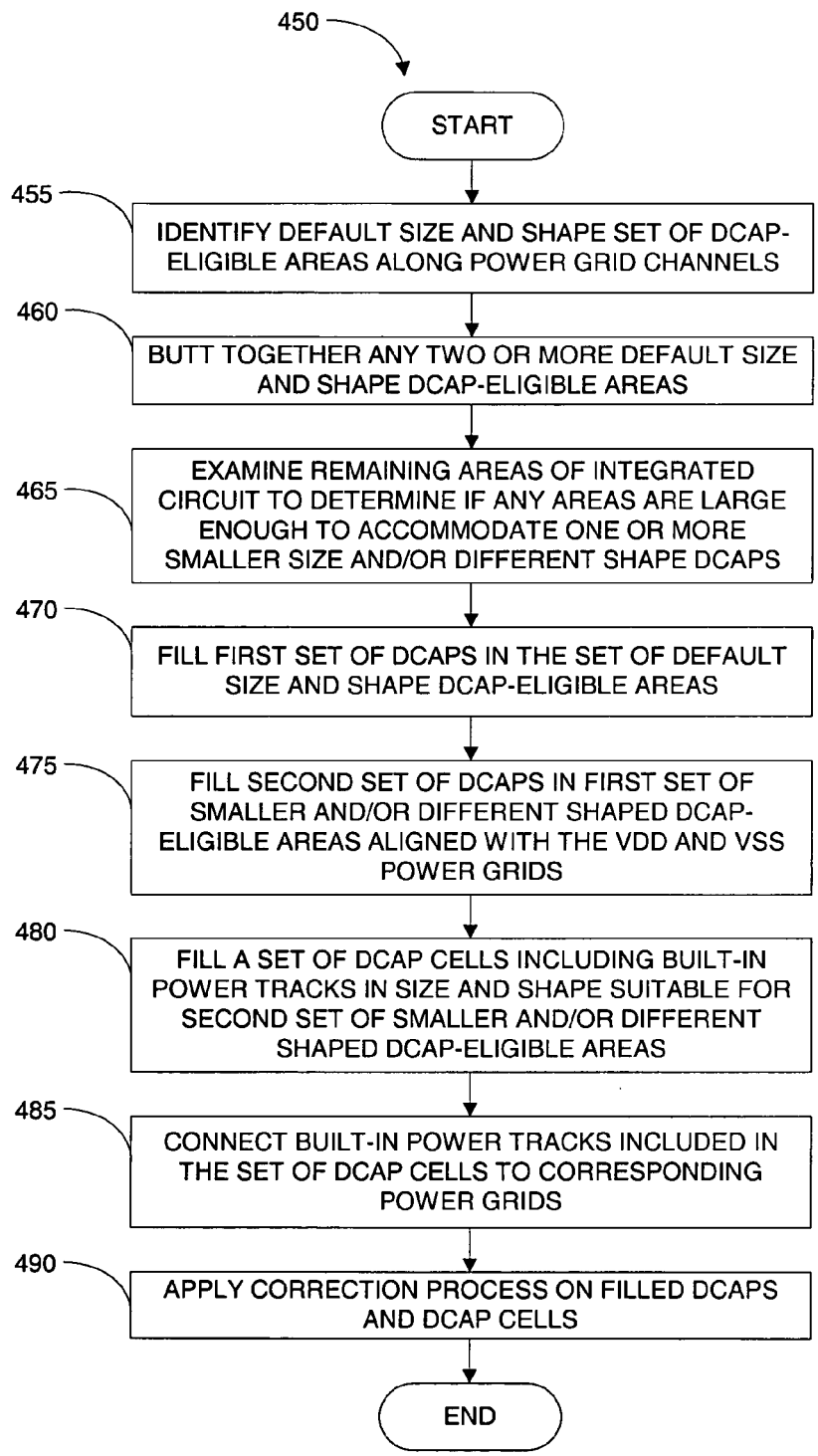

FIG. 4B is a flowchart diagram that illustrates the method operations 450 performed in filling and/or forming dcaps, in accordance with an embodiment of the present invention. In an operation 455, the prior art methods of identifying a default size and shape set of dcap-eligible areas along the power grid channels in an integrated circuit. By way of example, the Vdd and Vss power grids are examined to identify locations large enough to accommodate a default size and shape dcap.

In an operation 460, the default size and shape set of dcap-eligible areas are examined to determine if any of the default size and shape set of dcap-eligible areas can allow two or more dcaps to be butted together.

In an operation 465, the remaining areas of the integrated circuit are examined to determine if any areas are large enough to accommodate one or more smaller size and/or different shape dcaps. Two sets of smaller and/or different shaped dcap-eligible areas are identified in operation 465. A first set of smaller and/or different shaped dcap-eligible areas that are aligned with the corresponding power grids. A second set of smaller and/or different shaped dcap-eligible areas are also identified. The second set of smaller and/or different shaped dcap-eligible areas may or may not be directly aligned with the corresponding power grids.

In an operation 470, a first set of dcaps is filled in the set of default size and shape dcap-eligible areas. Filling the first set of dcaps can include automatically butting together two or more dcaps that can be butted together.

In an operation 475, a second set of dcaps is filled in the first set of smaller and/or different shaped dcap-eligible areas that are aligned with the Vdd and Vss power grids. Filling the second set of dcaps includes determining the shape and size of the second set of dcaps.

In an operation 480, a set of dcap cells including built-in power tracks are filled in the size and shape suitable for the second set of smaller and/or different shaped dcap-eligible areas. The built-in power tracks can be formed in a metal layer other than the metal layer containing the corresponding power grids. A minimum number of intervening metal layers and structures are formed between the metal layer containing the built-in power tracks and the metal layer including the corresponding power grids.

In an operation 485, the built-in power tracks included in the set of dcap cells are connected to the corresponding Vdd and Vss power grids.

In an optional operation 490, a correction process can be applied on the filled dcaps and dcap cells to correct any possible spacing and width violation.

An exemplary dcap fill process for a portion of an integrated circuit having an area that is square with 100 micron per side, then a Cartesian graph can be superimposed over the area so that the origin (e.g., coordinates of 0, 0) are at the lower left corner and 100 micron on the X-axis (e.g., coordinates of 100, 0) in the lower right corner and 100 micron on the Y-axis (e.g., coordinates of (0, 100) at the upper left corner. The upper right corner would have the coordinates of (100, 100). An exemplary selected dcap cell size is 2.0 micron height by a 3.0 micron width.

The default 100×100 micron square area can be examined in rows of rectangles 2 microns in height and 3 microns in width. The analysis of the area of the integrated circuit is performed in two phases. In a first phase the 100×100 micron square area is divided into 50 rows. Each row has a height substantially equal to the dcap cell being placed (e.g. 2.0 microns).

Each row is analyzed individually. One approach to individually analyze each row is to alternate the rows into temporary construction layers. By way of example, the odd numbered rows (e.g., 1, 3, 5, 7, . . . 49) are allocated to a first construction layer and the even numbered rows (e.g., 2, 4, 6, . . . 50) are allocated to a second construction layer. More construction layers can be used if desired. Separating the rows into construction layers assists in preserving the row-by-row data.

Each row is divided into rectangles having a height and a width substantially equal to the selected dcap cell size (e.g., 2.0 micron height and 3.0 micron width). Each rectangle of each row is analyzed to determine if a dcap can be placed in that location. A dcap cell can be placed in a selected rectangle if the rectangle does not include some feature, or in some instances even a portion of a feature, that might block placement of the dcap cell (e.g., a via). Once all 50 rows of rectangles have been analyzed in the first phase, the locations or areas that were acceptable to place a dcap cell are mapped (e.g., recorded) for future filling in of the dcap cells.

In a second phase, the process of the first phase is substantially repeated except that each one of several remaining areas of the integrated circuit are analyzed separately. For each of the remaining areas the origin (e.g., 0,0) is set at a lower left corner of each space remaining in the integrated circuit that was not designated for placement of dcap cells.

The row analysis can also include offsetting each row of rectangles. The offset can be, for example, one half the height of the dcap cell (e.g., 1.0 micron) or any other portion of the height of the dcap cell. The second phase analysis will identify rectangles that can accommodate a dcap cell but that were not identified in the first phase possibly because the first phase rectangle was partially blocked in the rows that were analyzed. Once all the remaining areas of the integrated circuit are analyzed in the second phase, the locations or areas that were acceptable to place a dcap cell are mapped (e.g., recorded) for future filling in of the dcap cells.

The analysis can be repeated with one or more alternate shapes or sizes for the dcap cells. By way of example, each rectangle not previously identified as accommodating the dcap can analyzed to determine if the alternate shape dcap can be accommodated.

The mapped dcap-eligible areas can be combined to determine how the dcap cells can be butted together to form larger effective area dcaps.

Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations. An exemplary structure for the invention is described below.

Figure 5:
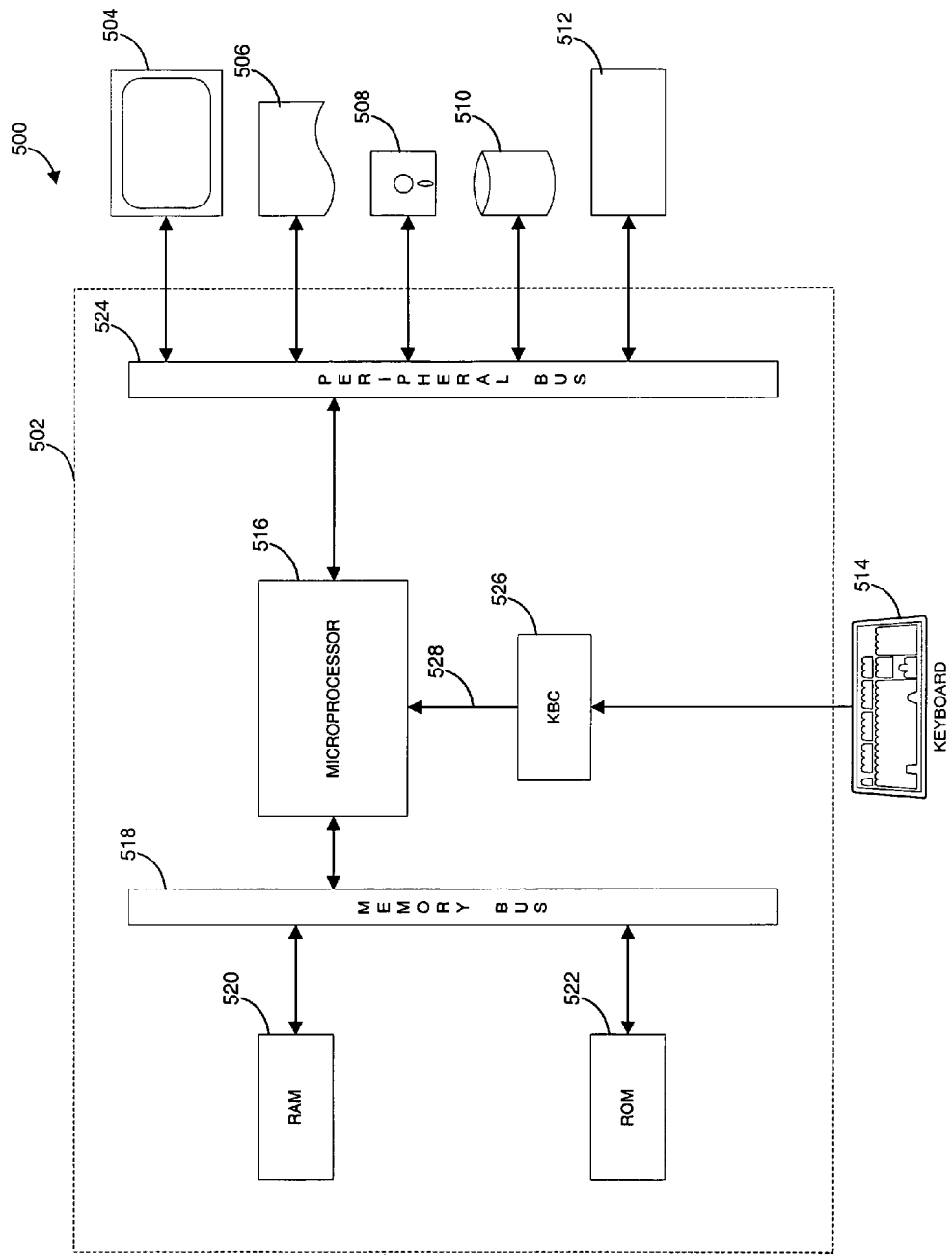
FIG. 5 is a block diagram of an exemplary computer system for carrying out the processing according an embodiment of the present invention.

FIG. 5 is a block diagram of an exemplary computer system 500 for carrying out the processing according an embodiment of the present invention. The computer system 500 includes a digital computer 502, a display screen (or monitor) 504, a printer 506, a floppy disk drive 508, a hard disk drive 510, a network interface 512, and a keyboard 514. The digital computer 502 includes a microprocessor 516, a memory bus 518, random access memory (RAM) 520, read only memory (ROM) 522, a peripheral bus 524, and a keyboard controller (KBC) 526. The digital computer 502 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 516 is a general-purpose digital processor, which controls the operation of the computer system 500. The microprocessor 516 can be a single-chip processor or can be implemented with multiple components. Using instructions retrieved from memory, the microprocessor 516 controls the reception and manipulation of input data and the output and display of data on output devices.

The memory bus 518 is used by the microprocessor 516 to access the RAM 520 and the ROM 522. The RAM 520 is used by the microprocessor 516 as a general storage area and as scratch-pad memory, and can also be used to store input data and processed data. The ROM 522 can be used to store instructions or program code followed by the microprocessor 516 as well as other data.

The peripheral bus 524 is used to access the input, output, and storage devices used by the digital computer 502. In the described embodiment, these devices include the display screen 504, the printer device 506, the floppy disk drive 508, the hard disk drive 510, and the network interface 512. The keyboard controller 526 is used to receive input from keyboard 514 and send decoded symbols for each pressed key to microprocessor 516 over bus 528.

The display screen 504 is an output device that displays images of data provided by the microprocessor 516 via the peripheral bus 524 or provided by other components in the computer system 500. The printer device 506, when operating as a printer, provides an image on a sheet of paper or a similar surface. Other output devices such as a plotter, typesetter, etc. can be used in place of, or in addition to, the printer device 506.

The floppy disk drive 508 and the hard disk drive 510 can be used to store various types of data. The floppy disk drive 508 facilitates transporting such data to other computer systems, and hard disk drive 510 permits fast access to large amounts of stored data.

The microprocessor 516 together with an operating system operates to execute computer code and produce and use data. The computer code and data may reside on the RAM 520, the ROM 522, or the hard disk drive 510. The computer code and data could also reside on a removable program medium and loaded or installed onto the computer system 500 when needed. Removable program media include, for example, CD-ROM, PC-CARD, floppy disk and magnetic tape.

The network interface 512 is used to send and receive data over a network connected to other computer systems. An interface card or similar device and appropriate software implemented by the microprocessor 516 can be used to connect the computer system 500 to an existing network and transfer data according to standard protocols.

A user to input commands and other instructions to the computer system 500 use the keyboard 514. Other types of user input devices can also be used in conjunction with the present invention. For example, pointing devices such as a computer mouse, a track ball, a stylus, or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of computer readable media including the RAM, the ROM, the hard disk drive or other computer readable medium.

Further still, the processes and design rules and parameters described in any of the above figures can also be implemented in software application such as computer aided design (CAD) tools, applications and systems. Such CAD software and systems tools are utilized on a wide scale in many research and development environments to design electrical, mechanical, chemical and/or other types of products. In the field of semiconductor design, such CAD tools help designers implement complex circuit architectures into semiconductor products. Such CAD tools are used for system level design, custom integrated circuit design tools, deep submicron design, logic design and verification, printed circuit board (PCB), package and interconnect design. A popular set of CAD tools, referred to as the Opus CAD design environment, is commercially available from Cadence Design Systems, Inc. of San Jose, Calif. In the Opus CAD design environment, the physical design of an integrated circuit depends on a set of design rules. The design rules are often determined inherently from the type of semiconductor fabrication technology, e.g., CMOS, NMOS, PMOS, etc. which is being utilized to implement the integrated circuit. Design rules typically define physical parameters and relationships such as minimum area, diagonal width, diagonal space, etc., of a physical entity in an integrated circuit. Throughout the development and design of an integrated circuit, such design rules are referenced directly and indirectly by both commercial CAD design tools and custom design tools developed in-house by the designers. Such custom design tools may be used to create designs, check designs for rule violations, or to preprocess or post process a design to or from other design tools. A subset of all of the design rules in the Opus CAD design environment is stored in an internal file referred to as a technical file or "Tech" file. The Tech file is used internally by the Opus CAD tool products.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit comprising:
   a power grid channel formed between at least two power grids;
   a plurality of dcaps including a first dcap included in a dcap cell, the dcap cell including built-in power tracks, each one of the built-in power tracks being connected to a corresponding one of the at least two power grids, wherein the built-in power tracks are formed in an adjacent metal layer to the metal layer including the power grids, and wherein the built-in power tracks are formed in an m1 metal layer of the integrated circuit and the power grids are formed in an m2 metal layer of the integrated circuit; and
   a plurality of dcap-eligible areas, each of the dcap-eligible areas including a plurality of rows, each one of the plurality of rows having a height substantially equal to a height of the dcap cell and wherein each one of the plurality of rows is divided into a plurality of equal shaped areas having a shape substantially equal to a shape of the dcap cell, wherein at least a portion of the plurality of dcaps are located within the power grid channel.

2. The integrated circuit of claim 1, wherein at least a portion of the plurality of dcaps are not located within the power grid channel.

3. The integrated circuit of claim 1, wherein the built-in power tracks have a pitch different than a pitch of the power grids.

4. The integrated circuit of claim 3, wherein the built-in power tracks have a pitch less than the pitch of the power grids.

5. The integrated circuit of claim 1, wherein two or more of the plurality of dcaps are butted together in at least one of a horizontal array or a vertical array.

6. The integrated circuit of claim 1, wherein the dcap cells include dcaps having a shape other than a default shape.

7. The integrated circuit of claim 1, wherein the corresponding power grids include at least one Vdd power grid and at least one Vss power grid.

8. The integrated circuit of claim 1, wherein the built-in power tracks included in the set of dcap cells are coupled to more than one corresponding power grids.

* * * * *